: US005675290A

United States Patent [19]
Tsukahara et al.

[11] Patent Number: 5,675,290
[45] Date of Patent: Oct. 7, 1997

[54] MICROWAVE AMPLIFIER CIRCUIT

[75] Inventors: Yoshihiro Tsukahara; Yoshinobu Sasaki, both of Tokyo, Japan

[73] Assignee: Mitsubishi Denki Kabushiki Kaisha, Tokyo, Japan

[21] Appl. No.: 630,482

[22] Filed: Apr. 10, 1996

[30] Foreign Application Priority Data

Aug. 9, 1995 [JP] Japan ................................. 7-203266

[51] Int. Cl.$^6$ ................................................. H03F 3/16
[52] U.S. Cl. ................................................. 330/277; 330/296
[58] Field of Search ................................. 330/277, 285, 330/286, 296, 302

[56] References Cited

U.S. PATENT DOCUMENTS 5,278,517 1/1994 Fujita ............................... 330/296 X
5,506,544 4/1996 Staudinger et al. ................ 330/277

Primary Examiner—Steven Mottola
Attorney, Agent, or Firm—Leydig, Voit & Mayer, Ltd.

[57] ABSTRACT

A microwave amplifier circuit includes an amplifier having a gate to which a microwave signal is input and an output terminal from which an amplified signal is output, and a gate bias resistor having a variable resistance connected between the gate of the amplifier and a gate bias terminal for controlling a voltage applied to the gate while maintaining a constant bias voltage at the gate. Even when variations occur in the threshold voltage of the amplifier because of process variations, the gain of the circuit can be held constant, without the bias voltage being adjusted, so that yield is improved.

4 Claims, 6 Drawing Sheets

MICROWAVE AMPLIFIER CIRCUIT

FIELD OF THE INVENTION

The present invention relates to a microwave amplifier circuit that can prevent gain variation.

BACKGROUND OF THE INVENTION

FIG. 11 is a diagram illustrating a circuit of a prior art microwave amplifier circuit using a field effect transistor (hereinafter referred to as an FET). In FIG. 11, reference numeral 1 designates an input terminal for a microwave signal to be amplified. Numeral 2 designates an output terminal of a circuit. Numeral 3 designates an FET amplifying an input signal. Numeral 4 designates a gate bias terminal for applying a bias voltage to the gate electrode of the FET 3. Numeral 5 designates a drain bias terminal for applying a bias voltage to the drain electrode of the FET 3. Numeral 21 designates a gate resistor connected between the gate bias terminal 4 and the gate electrode of the FET 3. Numeral 22 designates a condenser connected between an end of the resistor 21 at the gate bias terminal 4 and the ground. Numeral 23 designates a coil connected between the drain bias terminal 5 and the drain electrode of the FET 3. Numeral 24 designates a condenser connected between an end of the coil 23 at the drain bias terminal 5 and the ground. Numeral 100 designates an input matching circuit for impedance matching between the input side transmission line (not shown) and the microwave amplifier circuit. Numeral 200 designates an output matching circuit for impedance matching between the output side transmission line (not shown) and the microwave amplifier circuit.

A description is given of the operation of this microwave amplifier circuit. When a microwave signal is input to the input terminal 1, the signal impedance-matched by the input matching circuit 100 is input to the gate electrode of the FET 3. A gate bias voltage is applied to the gate electrode of the FET 3 via the gate resistor 21 and a drain bias voltage is applied to the drain electrode via the coil 23, respectively, and the input microwave signal is amplified by the FET 3 and the signal impedance-matched by the output matching circuit 200 is output from the output terminal 2.

This microwave amplifier circuit operating as described above has a gain which is determined by the characteristics of the FET, the gate bias voltage, and the drain bias voltage applied to the FET.

FIG. 12 shows the gain vs FET threshold voltage of the microwave amplifier circuit obtained from experiments.

As is apparent from FIG. 12, when the FET threshold voltage varies because of process variations, the yield is reduced due to gain variation. Therefore, in the prior art microwave amplifier circuit, the gate bias voltage applied to the gate electrode of the FET via the gate resistor is controlled by varying the voltage which is applied to the gate bias terminal, whereby a drain current that flows because a drain bias voltage is applied to the drain of the FET is adjusted, thereby suppressing the gain variation.

In the prior art microwave amplifier circuit constructed as described above, when variation arises in the FET threshold voltage because of process variations, the gate bias voltage has to be adjusted for each amplifier circuits to suppress gain variations.

SUMMARY OF THE INVENTION

It is an object of the present invention to provide a microwave amplifier circuit in which even when FET threshold voltage varies, no gain variation occurs, without the bias voltage applied from outside being adjusted.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a microwave amplifier circuit comprises an amplifier having an input terminal to which a microwave signal is input and an output terminal from which an amplified signal is output, and a gate bias resistor comprising a resistor having a variable resistor connected between the gate of the amplifier and the gate bias terminal for applying a gate bias voltage, and controlling a voltage applied to a gate of a transistor while maintained a constant voltage at the gate bias voltage. Therefore, even when variation occurs in the threshold voltage of the amplifier FET by such as process variations, the gain of the circuit can be held constant, without the bias voltage applied from outside being adjusted, whereby the yield is improved.

According to a second aspect of the present invention, in the above-described microwave amplifier circuit, the resistor comprises a variable resistor element.

According to a third aspect of the present invention, in the above-described microwave amplifier circuit, the resistor comprises a variable resistor element having a plurality of resistor elements which are arbitrarily selected to be used so as to obtain a desired resistance.

According to a fourth aspect of the present invention, in the above-described microwave amplifier circuit, the resistor comprises a resistor element having an end connected to the gate bias terminal and the other end connected to the gate of the amplifier, an amplifier serving as a resistor whose gate is connected to the gate bias terminal and whose source and drain are, respectively, connected to the gate of the amplifier and the ground, and a by-pass resistor element having an end connected to the source of the amplifier serving as a resistor and the other end connected to the drain of the amplifier serving as a resistor.

According to a fifth aspect of the present invention, a microwave amplifier circuit comprises an amplifier having an input terminal to which a microwave signal is input and an output terminal from which an amplified signal is output, and a drain bias resistor comprising a resistor element having a variable resistance connected between the drain of the amplifier and a drain bias terminal for applying a drain bias voltage. Thereby, even when variation occurs in the threshold voltage of the amplifier FET by such as process variations, the gain of the circuit can be held constant, without the bias voltage applied from outside being adjusted, whereby the yield is improved.

According to a sixth aspect of the present invention, in the above-described microwave amplifier circuit, the resistor comprises a variable resistor element.

According to a seventh aspect of the present invention, in the above-described microwave amplifier circuit, the resistor comprises a variable resistor element having a plurality of resistor elements which are arbitrarily selected to be used so as to obtain a desired resistance.

According to an eighth aspect of the present invention, in the above-described microwave amplifier circuit, the resistor comprises a resistor element having an end connected to the drain bias terminal and the other end connected to the drain of the amplifier, an amplifier serving as a resistor whose gate is connected to the drain bias terminal and whose source and drain are, respectively, connected to the drain of the amplifier and the ground, and a by-pass resistor having an end connected to the source of the amplifier serving as a resistor and the other end connected to the drain of the amplifier serving as a resistor.

DETAILED DESCRIPTION OF THE PREFERRED EMBODIMENTS

Embodiment 1

Figure 1:
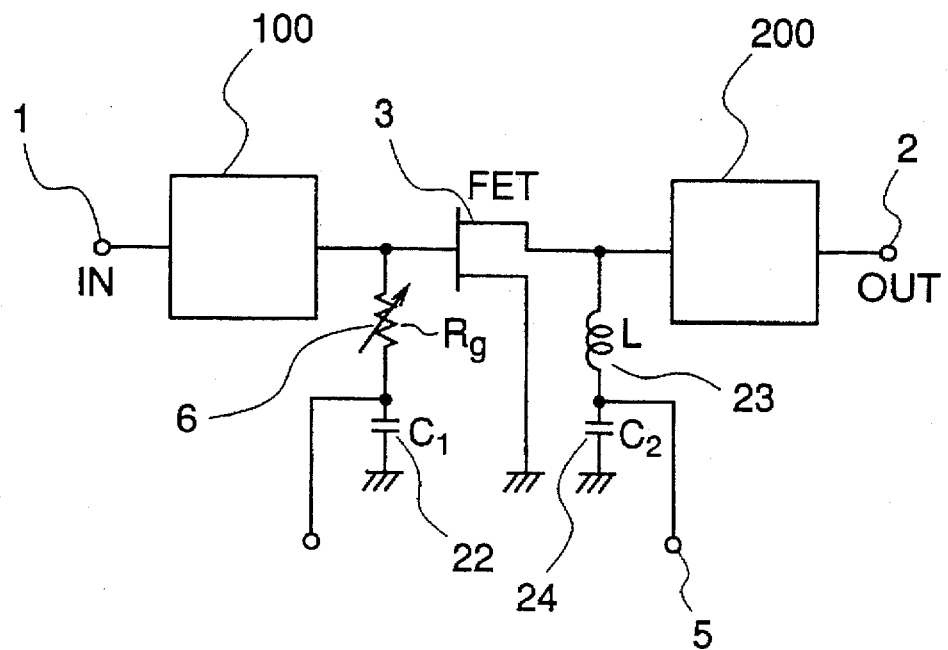
FIG. 1 is a diagram illustrating a microwave amplifier circuit as a first example according to a first embodiment of the present invention.

A microwave amplifier circuit according to a first embodiment of the present invention comprises, as shown in FIG. 1, an amplifier 3 which amplifies a microwave signal input to the input terminal 1 and outputs the amplified signal to the output terminal 2, and a gate bias resistor 6 comprising a resistor element having a variable resistance connected between the gate of the amplifier 3 and the gate bias terminal 4 for applying a gate bias voltage. Thereby, even when variation occurs in the threshold voltage of the amplifier FET 3 because of process variations, the gain of the circuit can be held constant, without the bias voltage applied from the outside being adjusted, whereby the yield is improved.

A description is given of the microwave amplifier circuit according to the first embodiment in more detail.

(1) FIG. 1 is a diagram illustrating a microwave amplifier circuit as a first example according to the first embodiment.

In FIG. 1, reference numeral 1 designates an input terminal for a microwave signal. The microwave signal input to this input terminal 1 is impedance matched by the input matching circuit 100 comprising a condenser, a coil, a resistor, and a distributed constant line, and is input to the gate electrode of the FET 3. A voltage applied to the gate bias terminal 4 is applied to the gate electrode of the FET 3 via the variable gate resistor 6, as a gate bias voltage. In addition, a voltage applied to the drain bias terminal 5 is applied to the drain electrode of the FET 3 as a drain bias voltage, and the microwave signal input to the gate electrode of the FET 3 is amplified by the FET 3, the signal which is output impedance-matched by the output matching circuit 200 comprising a condenser, a coil, a resistor, and a distributed constant line, is output from the output terminal 2. Reference numeral 22 designates a condenser connected between an end of the variable gate resistor 6 at the gate bias terminal 4 and the ground. Numeral 23 designates a coil connected between the drain bias terminal 5 and the drain electrode of the FET 3. Numeral 24 designates a condenser connected between an end of a coil 23 at the drain bias terminal 5 and the ground.

The microwave amplifier circuit as the first example in the first embodiment is constructed such that a variable gate resistor 6 is employed as a gate bias resistor, and the resistance thereof is set in accordance with the threshold voltage of the respective FET to adjust the gate bias voltage applied to the gate electrode of the FET 3. Therefore, even when variation occurs in the threshold voltage of the FET 3 because of process variations, the gain of the circuit can be held constant, without the voltages applied to the gate bias terminal 4 and the drain bias terminal 5 being adjusted, respectively, whereby the yield of the circuit is improved.

The principle for gain adjustment in the microwave amplifier circuit of this first example will be described with reference to FIGS. 1 and 2.

Figure 2:
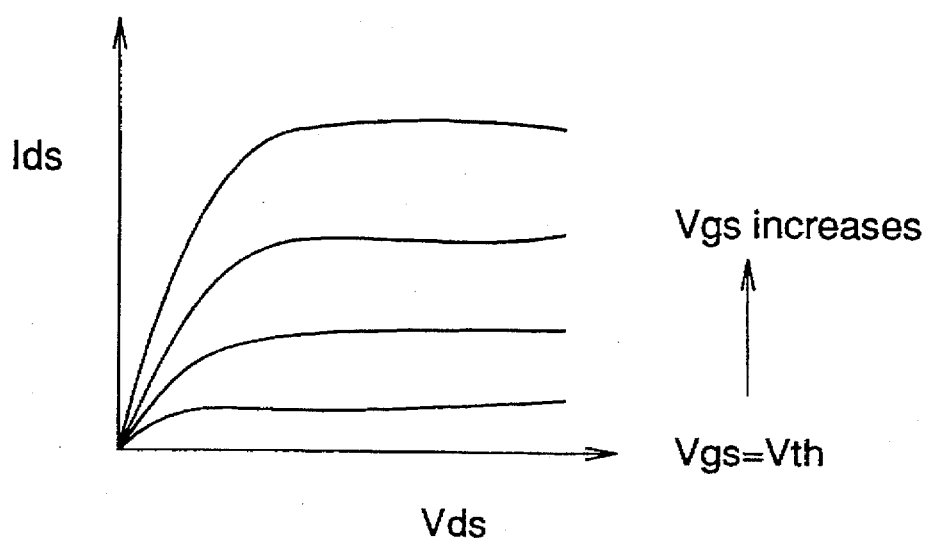
FIG. 2 is a diagram illustrating a drain current characteristic of an FET in the microwave circuit of FIG. 1.

First of all, the relation between the gate bias voltage and the circuit gain is described with reference to FIG. 2 illustrating the drain current characteristic of the FET. In FIG. 2, reference character Ids denotes a drain current of the FET, Vds denotes a drain bias voltage, Vgs denotes a gate bias voltage, and Vth denotes the threshold voltage. As is apparent from FIG. 2, when the gate bias voltage Vgs of the FET is varied toward the negative voltage direction, i.e., toward the threshold voltage Vth, the drain current Ids is reduced, whereby the circuit gain is reduced. On the contrary, when the gate bias voltage Vgs is varied toward the positive voltage, i.e., away from the threshold voltage Vth, the drain current Ids increases, whereby the circuit gain also increases. In this way, by controlling the gate bias voltage Vgs, the gain adjustment of the circuit can be performed.

The principle for gain adjustment of the circuit when the threshold voltage Vth of the FET 3 is varied because of process variations will be described.

In the microwave amplifier circuit as the first example shown in FIG. 1, the circuit gain G, when the threshold voltage Vth of the FET 3 is −1.0 V, the voltage Vg applied to the gate bias terminal 4 is −1.0 V, the voltage Vd applied to the drain bias voltage 5 is 3.0 V, and the resistance Rg of the variable gate resistor 6 is 50KΩ, is considered as a reference. Normally, since a leakage current Idg of about $10 \times 10^{-6}$ amperes flows between the drain and gate of the FET, the gate bias voltage Vgs applied to the gate electrode with these settings becomes as follows:

$$Vgs = Vg + Idg \times Rg$$

$$= -1.0 + 10 \times 10^{-6} \times 50 \times 10^3 = -0.5 \text{ V}$$

Figure 12:
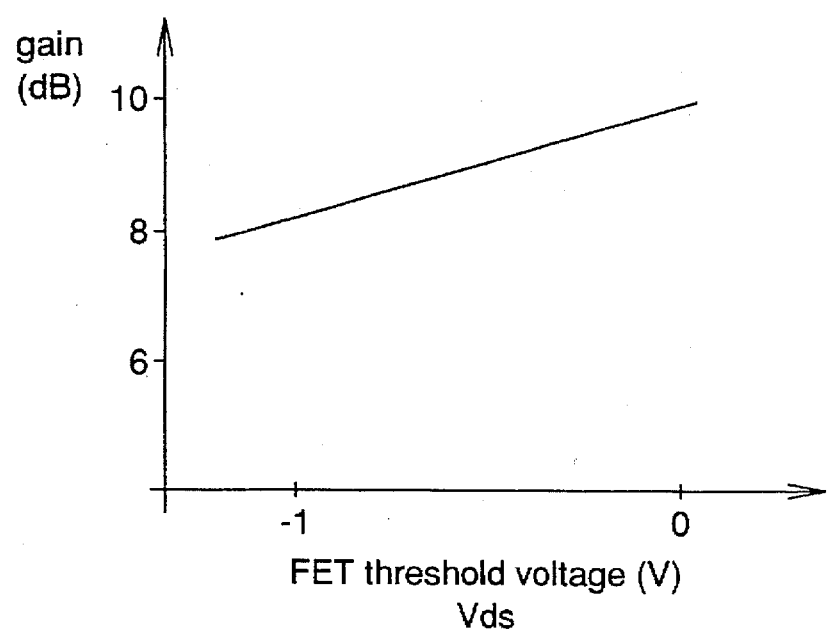
FIG. 12 is a diagram illustrating the change of the circuit gain against the change of the FET threshold voltage in the prior art amplifier circuit.

On the other hand, when the threshold voltage Vth of the FET 3 is shallow because of process variations, for example, when the Vth=−0.8 V is G1, G1 becomes, as apparent from FIG. 12, G1>G and the circuit gain increases. In such a case, if the resistance of the variable gate resistor 6 Rg equals 30 KΩ, the gate bias voltage applied to the gate electrode Vgs becomes:

$$\begin{aligned} Vgs &= Vg + Ids \times Rg \\ &= -1.0 + 10 \times 10^{-6} + 30 \times 10^3 = -0.7 \text{ V} \end{aligned}$$

and the gate bias voltage Vgs changes toward the negative voltage direction, i.e., toward the threshold voltage Vth. When the gate bias voltage Vgs changes toward the negative voltage direction as such, the circuit gain is reduced. Therefore, because the resistance Rg of the variable gate resistor 6 is set lower in response to an increase in the threshold voltage Vth of the FET 3, an increase in the gain accompanying the change in the threshold voltage Vth is canceled, whereby variation in the gain is reduced.

In the microwave amplifier circuit according to this first example, the variable gate resistor 6 is connected between the gate bias terminal 4 and the gate electrode of the FET 3, whereby even when the threshold voltage Vth of the FET 3 varies because of process variations, the resistance of the gate resistor can be set in accordance with the variation. Thus, the circuit gain can be kept constant, without voltages applied to the gate bias terminal 4 and the drain bias terminal 5 being adjusted.

Figure 3:
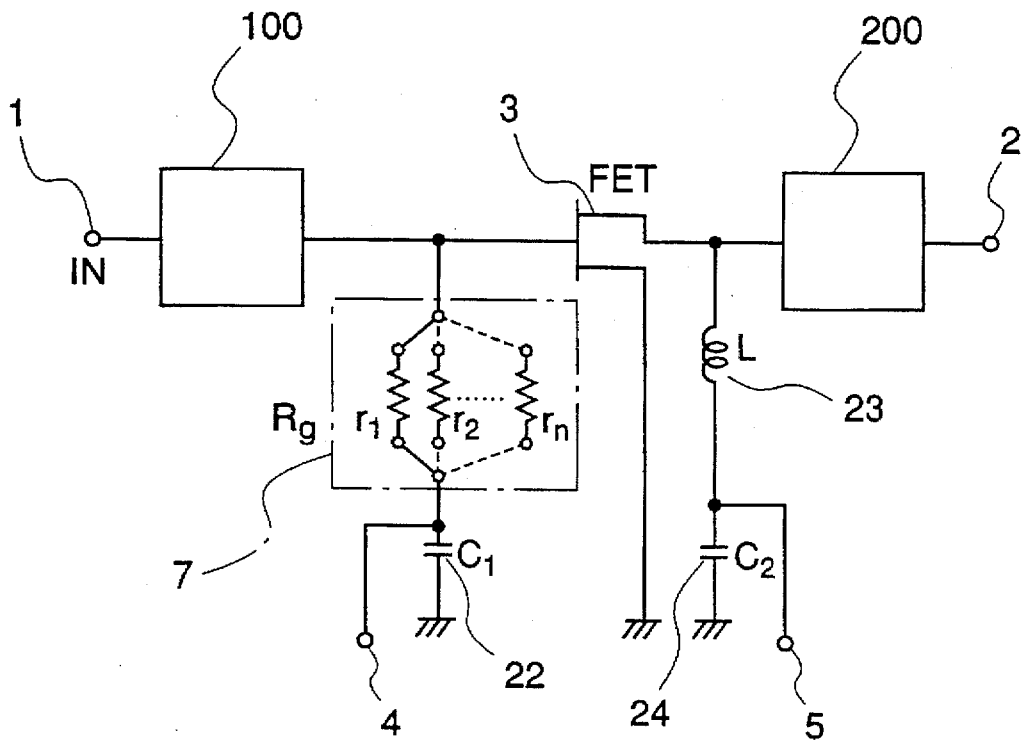
FIG. 3 is a diagram illustrating a microwave amplifier circuit as a second example according to the first embodiment of the present invention.

(2) A second example of a microwave amplifier circuit according to the first embodiment of the present invention will be described. FIG. 3 is a diagram illustrating a circuit of this second example. In FIG. 3, numeral 7 designates a variable gate resistor provided in place of the variable gate resistor 6 in FIG. 1. This variable gate resistor 7 includes n resistor elements r1~rn having respective resistances and provides a desired resistance when n resistor elements are connected arbitrarily. In FIG. 3, the same reference numerals as in FIG. 1 designate the same parts.

In the microwave amplifier circuit of this second example, the variable gate resistor 7 is connected between the gate bias terminal 4 and the gate electrode of the FET 3. Therefore, even when the threshold voltage Vth of the FET 3 varies because of process variations, the resistance of the gate resistor can be adjusted in accordance with the variation in the threshold voltage by using required resistor elements arbitrarily connected in series or in parallel among the resistors r1~rn of the variable gate resistor 7, whereby the circuit gain can be made constant, without the voltages applied to the gate bias terminal 4 and the drain bias terminal 5 being adjusted.

Figure 4:
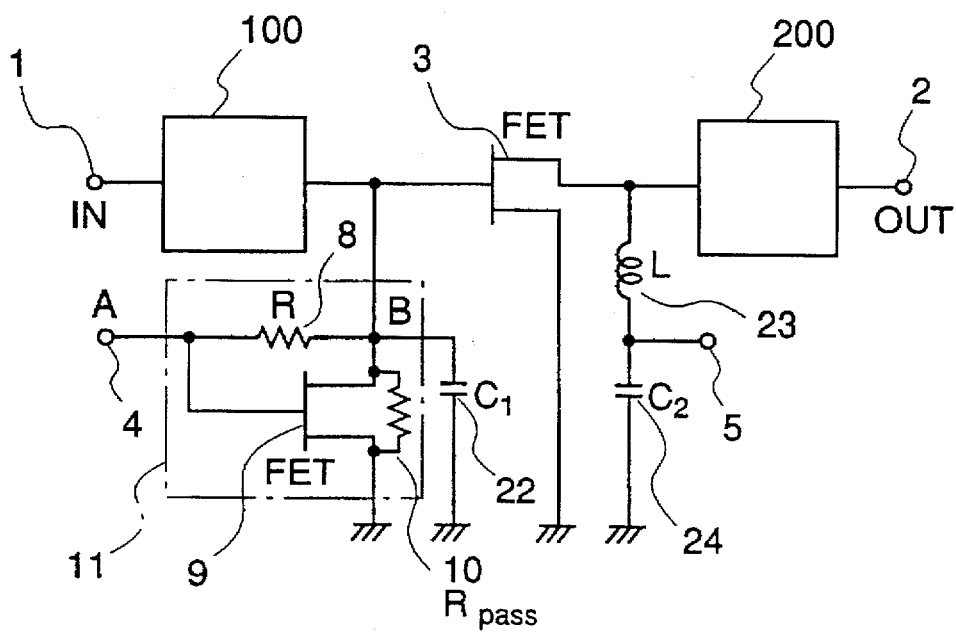
FIG. 4 is a diagram illustrating a microwave amplifier circuit as a third example according to the first embodiment of the present invention.

(3) A description is given of a microwave amplifier circuit as a third example according to the first embodiment of the present invention. FIG. 4 is a diagram illustrating an amplifier circuit of this third example. Reference numeral 8 designates a resistor element connected between the gate bias terminal 4 and the gate of the FET 3. This resistor 8 constitutes a resistor body 11 with an FET serving as a resistor 9 having a gate connected to the gate bias terminal 4 of the FET 3 and a drain and a source respectively connected to the gate of the FET 3 and the ground, and a by-pass resistor 10 having a resistance $R_{pass}$ connected between the drain and the source of the FET serving as a resistor 9. The other elements are also shown in FIG. 1 and designate the same or corresponding parts.

Particularly, in the microwave amplifier circuit of this third example, as a gate bias resistor of the FET 3, a resistor body 11 comprising the resistor 8 connected between the gate bias terminal 4 and the gate of the FET 3, the FET serving as a resistor 9 having a gate connected to the gate bias terminal 4 and a source and a drain respectively connected to the gate of the FET 3 and the ground, and the by-pass resistor 10 connected between the source and the drain of the FET serving as a resistor 9 is employed, whereby even when variation occurs in the threshold voltage of the FET 3 because of process variations, the circuit gain can be kept constant, without the voltages applied to the gate bias terminal 4 and the drain bias terminal 5 being adjusted, respectively, whereby the yield can be improved.

A description is given of the principle of the gain adjustment in the microwave amplifier circuit of this third example.

Figure 5:
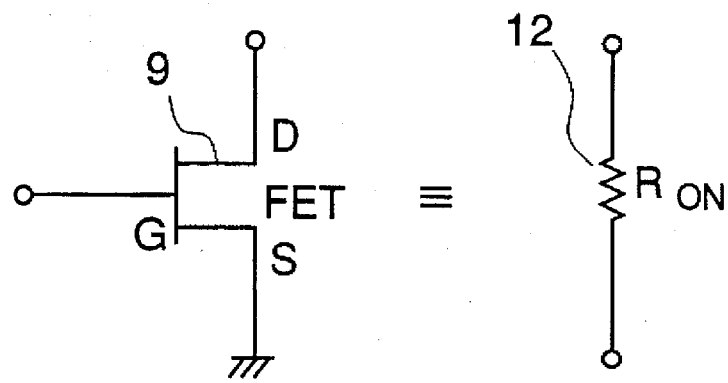
FIG. 5 is a diagram illustrating an equivalent circuit between the source and drain of an FET serving as a resistor in the third example according to the first embodiment.
Figure 6:
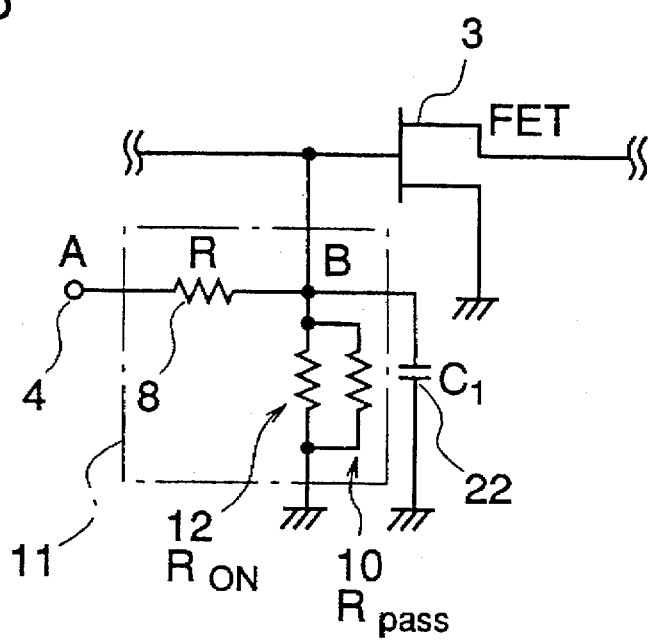
FIG. 6 is a diagram illustrating a resistor in the microwave amplifier circuit as the third example according to the first embodiment.

FIG. 5 is a diagram illustrating an equivalent circuit of the inter drain-source resistance arising because of the voltage difference between the gate and source of the FET serving as a resistor 9. In FIG. 5, reference numeral 12 designates an equivalent resistance having a resistance $R_{on}$. FIG. 6 is a diagram illustrating a circuit of the resistor body 11 when the FET serving as a resistor 9 is represented by the equivalent resistance 12.

When a voltage −Vg is applied to the gate bias terminal 4, a voltage −Vg is also applied to the gate electrode of the FET serving as a resistor 9 and a voltage difference −Vg is generated between the gate and source of the FET serving as a resistor 9, whereby the FET serving as a resistor 9 is operated. The voltage of the point B then can be represented by $$VB = -\{R'/(R'+R)\} \times Vg$$

where, $R' = (R_{on} \cdot R_{pass})/(R_{on} + R_{pass})$. The voltage of the point B becomes the gate bias voltage of the FET 3, whereby the FET 3 is operated by the voltage VB.

When, for example, the threshold voltage of the FET 3 and the FET serving as a resistor 9 are made shallow by process variations, the gain of the amplifier circuit increases as is apparent from FIG. 12. On the other hand, when the threshold value becomes shallow, the drain current of the FET serving as a resistor 9 decreases, and this means that the resistance $R_{on}$ of the inter drain source resistance of the FET serving as a resistor 9 is large. When this resistance $R_{on}$ increases, the value R' increases and, as a result, the voltage VB of the point B, i.e., the gate bias voltage of the FET 3, changes in the direction toward the negative voltage. When the gate bias voltage varies in the direction toward the negative voltage, the circuit gain decreases as is apparent from FIG. 2, thereby canceling the increase in the circuit gain due to reduction in the threshold voltage of the FET 3. In the microwave amplifier circuit of this third example, as the gate bias resistor, a resistor body 11 comprising the resistor element 8 is connected between the gate bias terminal 4 and the gate of the FET 3, and the FET serving as a resistor 9 has a gate connected to the gate bias terminal 4 and a source and a drain respectively connected to the gate of the FET 3 and the ground. The by-pass resistor 10 is connected between the source of the FET serving as a resistor 9 and the drain thereof. Therefore, even when the threshold voltage of the FET 3 varies because of process variations, the variation in the threshold voltage can be canceled by the variation in the drain-source resistance of the FET serving as a resistor 9, i.e., $R_{on}$, whereby the circuit gain can be kept constant, without the voltages which are applied to the gate bias terminal 4 and the drain bias terminal 5 being adjusted. While, in the first to third examples, the variable gate resistor 6, the variable gate resistor body 7, and the resistor body 11 are separate from the input matching circuit 100, these elements can be incorporated in the input matching circuit 100 with the same effects.

Embodiment 2

Figure 7:
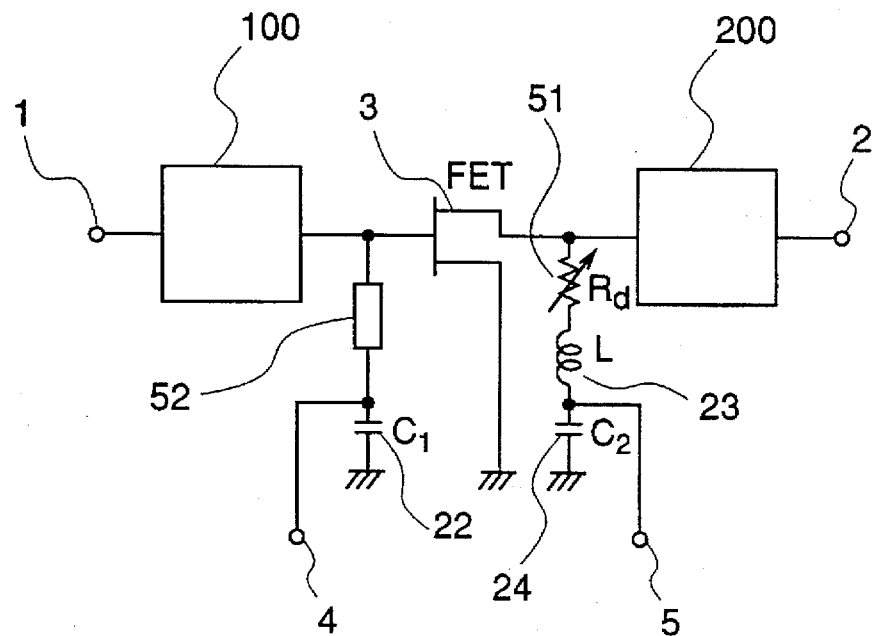
FIG. 7 is a diagram illustrating a microwave amplifier circuit as a first example according to a second embodiment of the present invention.

A microwave amplifier circuit according to a second embodiment of the present invention includes, as shown in FIG. 7, an amplifier 3 having an input terminal 1 to which a signal is input and outputting an amplified signal to the output terminal 2, and a drain bias resistor 51 comprising a resistor having a variable resistance connected between the drain of the amplifier 3 and the drain bias terminal 5 for applying a drain bias voltage, whereby even when variation occurs in the threshold voltage of the amplifier because of process variations, the gain of the circuit can be held constant, without the bias voltage applied from outside being adjusted, thereby improving the yield.

The microwave amplifier circuit according to the second embodiment will be described.

(1) FIG. 7 is a diagram illustrating a circuit of a microwave amplifier circuit as a first example according to the second embodiment. In FIG. 7, reference numeral 51 designates a variable drain resistor connected between the coil 23 connected to the drain bias terminal 5 and the drain electrode of the FET 3. Numeral 52 designates a gate bias terminal connected between the gate bias terminal 4 and the gate electrode of the FET 3. In FIG. 7, the same reference numerals as in FIG. 1 designate the same parts.

More particularly, the microwave amplifier circuit of this first example includes the variable drain resistor 51 connected between the coil 23 and the drain electrode of the FET 3. The resistance of the variable drain resistor 51 is set in accordance with the threshold voltages of respective FETs and, the drain bias voltage applied to the drain electrode of the FET 3 is thereby adjusted. Therefore, even when variation occurs in the threshold voltage of the FETs 3 because of process variations, the circuit gain can be kept constant, without the voltages applied to the gate bias terminal 4 and the drain bias terminal 5 being adjusted, whereby the yield can be improved.

A description is given of the principle of the gain adjustment in the microwave amplifier circuit of this first example.

Figure 8:
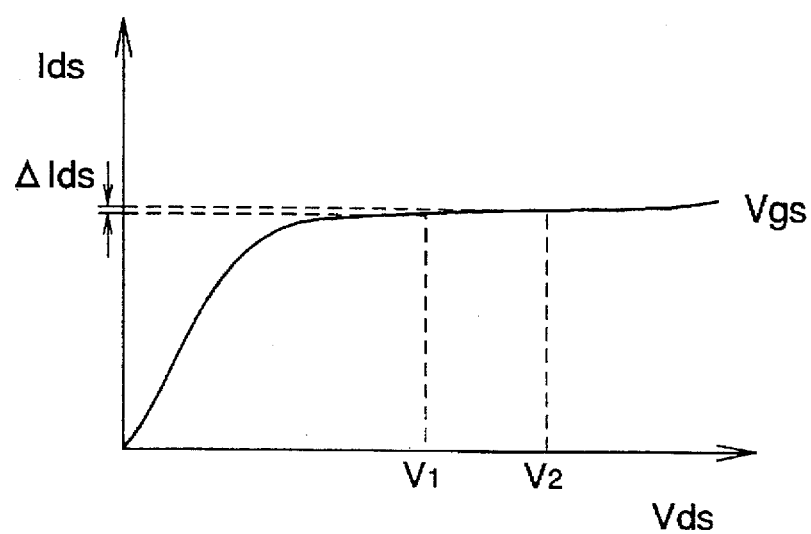
FIG. 8 is a diagram illustrating a drain current characteristic of the FET in the microwave amplifier circuit of FIG. 7.

First of all, a description is given of the relation between the drain bias voltage and the circuit gain using the drain current characteristic of the FET shown in FIG. 8. In FIG. 8, reference character Ids denotes a drain current of an FET, Vds denotes a drain bias voltage, and Vgs denotes a gate bias voltage. As is apparent from this FIG. 8, when the drain bias voltage of the FET Vds reduces to V2 from V1, the drain current Ids reduces by ΔIds, whereby the circuit gain is reduced. On the contrary, when the drain bias voltage Vds increases to V1 from V2, the drain current Ids increases by ΔIds, whereby the circuit gain increases. In this way, the gain adjustment of the circuit can be performed by controlling the drain bias voltage Vds.

The principle of the gain adjustment of the circuit when the threshold voltage of the FET 3 varies because of process variations will be described.

As is apparent from FIG. 12, in the microwave amplifier circuit, when the threshold voltage of the FET 3 is made shallow because of process variations, i.e., shifts in the direction toward the positive voltage, the gain of the circuit increases.

On the other hand, when the drain-sources resistance in a conducting state of the FET 3 in the microwave amplifier circuit of the first example is Rf, the resistance of the variable drain resistor 51 is Rd, and the voltage applied to the drain bias terminal 5 is Vd, the drain bias voltage Vds applied to the drain electrode is represented by:

$$Vds=[Rf/(Rf+Rd)]\times Vd$$

As is apparent from this FIG. 12, when the resistance Rd of the variable drain resistor 51 is increased, the drain bias voltage Vgs is reduced. When the drain bias voltage Vds is reduced, the gain of the circuit is reduced as is apparent from FIG. 8 and, therefore, if the resistance Rd of the variable drain resistor 51 is set low in accordance with an increase in the threshold voltage of the FET 3, the increase in the gain accompanying the increase in the threshold voltage is canceled, whereby the gain variation is prevented.

In the microwave amplifier circuit of this first example, since the variable drain resistance 51 is connected between the drain bias terminal 5 and the drain electrode of the FET 3, even when the threshold voltage Vth of the FET 3 is varied because of process variations, the resistance of the drain resistor can be set in accordance with the variation in the threshold voltage, whereby the circuit gain can be kept constant, without the voltages applied to the gate bias terminal 4 and the drain bias terminal 5 being adjusted.

(2) A description is given of a microwave amplifier circuit as a second example according to the second embodiment.

Figure 9:
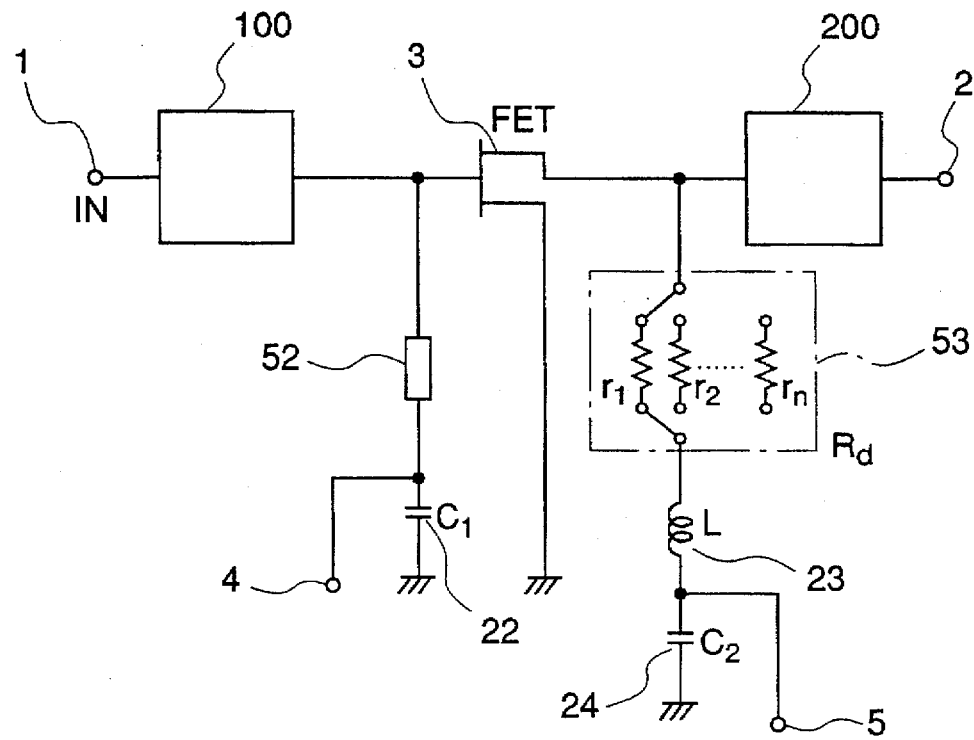
FIG. 9 is a diagram illustrating a microwave amplifier circuit as a second example according to the second embodiment of the present invention.

FIG. 9 is a diagram illustrating a microwave amplifier circuit of a second example. In FIG. 9, reference numeral 53 designates a variable drain resistor provided in place of the variable drain resistor 51 shown in FIG. 8. The variable drain resistor 53 includes n resistors r1-rn having respectively resistances, and when the n pieces of resistors are arbitrarily connected with each other, a desired resistance can be obtained. The same reference numerals as in FIG. 1 designate the same parts.

In the microwave amplifier circuit of this second example, since the variable drain resistor 53 is connected between the drain bias terminal 4 and the gate electrode of the FET 3, even when the threshold voltage Vth of the FET 3 varies because of variations, required resistors among the resistors r1-rn in the variable drain resistor 53 are connected in series or in parallel with each other, whereby the resistance of the gate resistor can be set in accordance with the variation in the threshold voltage and the circuit gain can be kept constant, without the voltages applied to the gate bias terminal 4 and the drain bias terminal 5 being adjusted.

Figure 10:
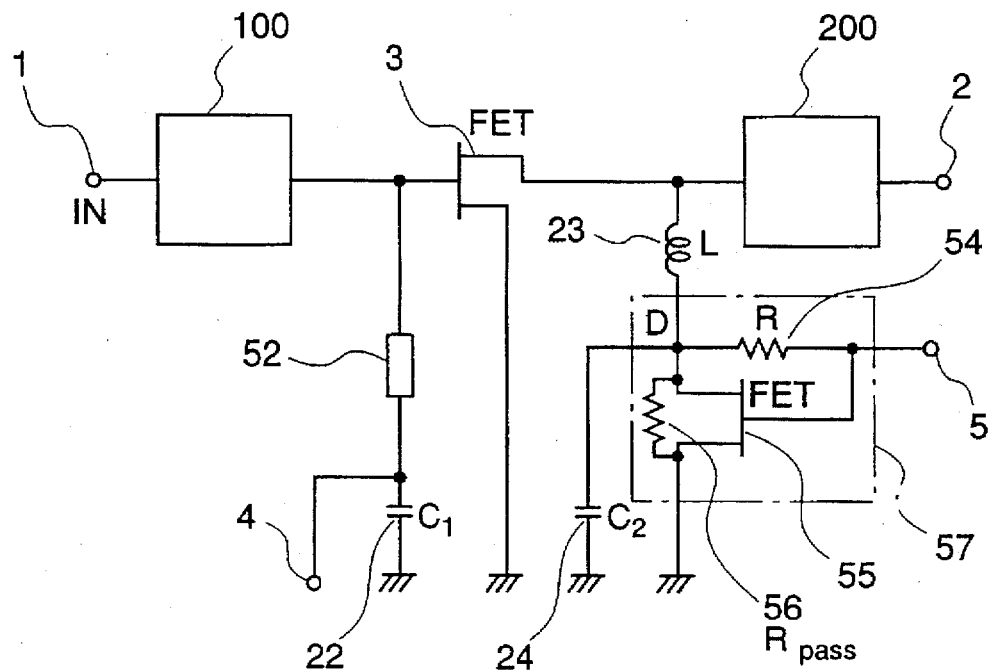
FIG. 10 is a diagram illustrating an amplifier circuit as a third example according to the second embodiment of the present invention.
Figure 11:
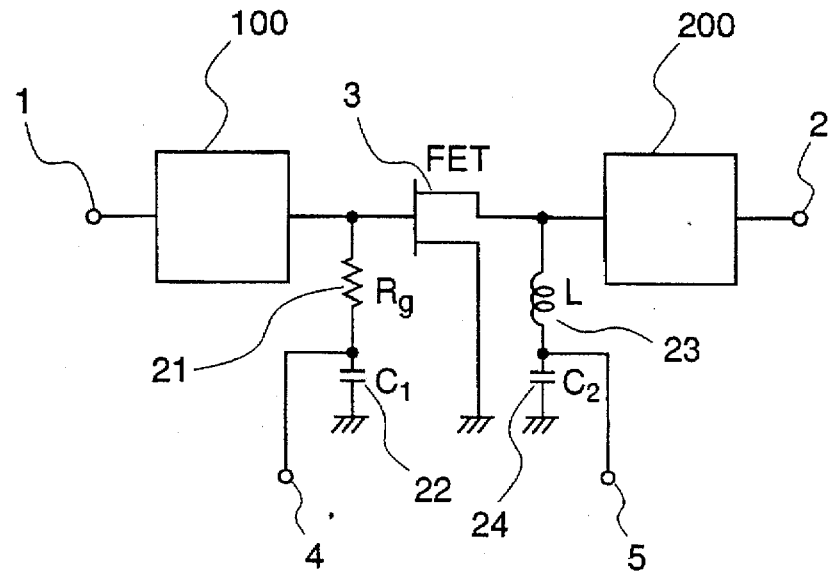
FIG. 11 is a diagram illustrating a prior art amplifier circuit.

(3) A description is given of a microwave amplifier circuit as a third example according to the second embodiment. FIG. 10 is a diagram illustrating a circuit of the third example. In FIG. 10, reference numeral 54 designates a resistor connected between the drain bias terminal 5 and the drain of the amplifier FET 3. This resistor 54 constitutes the resistor 57 with the FET serving as a resistor 55 having a gate connected to the drain bias terminal 4, and a drain and a source respectively connected to the drain of the FET 3 and the ground. A by-pass resistor 56 having a resistance $R_{pass}$ is connected between the drain and source of the FET serving as a resistor 55. The same reference numerals as in FIG. 1 designate the same or corresponding parts.

More particularly, the microwave amplifier circuit of this third example includes, as a drain bias resistor, a resistor body 57 comprising a resistor 54 having one end connected to the drain bias terminal 5 and an other end connected to the drain of the FET 3 via the coil 23, and an FET serving as a resistor 55 having a gate connected to the drain bias terminal 5 and a source and a drain respectively connected to the drain of the FET 3 and the ground. A by-pass resistor 56 is connected between the source and the drain of the FET serving as a resistor 55. Thereby, even when variation occurs in the threshold voltage of the FET 3 because of process variations, the gain of the circuit is kept constant, without the voltages applied to the gate bias terminal 4 and the drain bias terminal 5 being adjusted, respectively, whereby the yield is improved.

A description is given of the principle of gain adjustment in the microwave amplifier circuit of the third example.

When a voltage Vd is applied to the drain bias terminal 5, a voltage Vd is also applied to the FET serving as a resistor 55, whereby the FET serving as a resistor 55 is operated. The voltage at the point D when the drain-source resistance of the FET serving as a resistor 55 is made $R_{on}$, is represented by $$VD = \{R''/(R''+R)\} \times Vd$$

where, $R'' = (R_{on} \cdot R_{pass})/(R_{on} + R_{pass})$. The voltage of this point D becomes a drain bias voltage of the FET 3.

When the threshold voltage of the FET 3 and the FET serving as a resistor 55 are made shallow because of process variations, as is apparent from FIG. 12, the gain of the amplifier circuit increases. On the other hand, when the threshold voltage is made shallow, the drain current of the FET serving as a resistor 55 is reduced, that is, the resistance $R_{on}$ of the drain source resistance of the FET serving as a resistor 55 increases. When this resistance $R_{on}$ increases, the resistance R" also increases and, the voltage Vd of the point D, i.e., the drain bias voltage of the FET 3 is reduced. The reduction in the drain bias voltage reduces the circuit gain, as is apparent from FIG. 8, whereby the increase in the circuit gain due to the threshold value of the FET 3 being shallow, can be canceled.

In the microwave amplifier circuit of this third example, as a drain bias resistor, a resistor body 57 comprising the resistor 54 is connected between the drain bias terminal 5 and the drain of the FET 3, and an FET serving as a resistor 55 has a gate connected to the drain bias terminal 5 and a source and a drain respectively connected to the drain of the FET 3 and the ground. A by-pass resistor 56 having one end connected to the source of the FET serving as a resistor 55 and an other end connected to the drain of the FET 55 is employed, whereby even when the threshold voltage of the FET 3 is varied because of process variations, the variation can be canceled by the variation of the drain-source resistance $R_{on}$ of the FET serving as a resistor 55. Thereby, the gain of the circuit can be kept constant, without the voltages applied to the gate bias terminal 4 and the drain bias terminal 5 being adjusted.

While, in the first to third examples, the variable drain resistor 51, the variable drain resistors 53, and the resistor body 57 are separate from the output matching circuit 200, these elements may be incorporated in the output matching circuit 200, with the same effects.

What is claimed is:

1. A microwave amplifier circuit comprising:

an amplifier having a gate to which a microwave signal is input, an output terminal from which an amplified signal is output, and a gate bias terminal to which a gate bias voltage is applied; and a gate bias resistor connected between the gate of the amplifier and the gate bias terminal for controlling the gate bias voltage while maintaining a constant bias voltage at the gate and comprising:

a fixed resistor element having a first end connected to the gate bias terminal and a second end connected to the gate;

a second amplifier functioning as a resistor and including a gate connected to the gate bias terminal, a source, and a drain, respectively connected to the gate of the amplifier and ground; and a by-pass resistor connected between the source and the drain of the second amplifier.

2. A microwave amplifier circuit comprising;

an amplifier having a gate to which a microwave signal is input, an output terminal from which an amplified signal is output, and a gate bias terminal to which a gate bias voltage is applied; and a gate bias resistor connected between the gate of the amplifier and the gate bias terminal for controlling the gate bias voltage while maintaining a constant bias voltage at the gate and including a plurality of fixed resistance elements some or all of which may be arbitrarily connected in series, parallel, or series and parallel to produce the gate bias resistor maintaining the constant bias voltage at the gate.

3. A microwave amplifier circuit comprising:

an amplifier having an input terminal to which a microwave signal is input, a drain from which an amplified signal is output, and a drain bias terminal to which a drain bias voltage is applied; and a drain bias resistor connected between the drain of the amplifier and the drain bias terminal for controlling the drain bias voltage and comprising:

a fixed resistor element having a first end connected to the drain bias terminal and a second end connected to the drain;

a second amplifier functioning as a resistor and including a gate connected to the drain bias terminal, a source, and a drain, respectively connected to the drain of the amplifier and ground; and a by-pass resistor connected between the source and the drain of the second amplifier.

4. A microwave amplifier circuit comprising:

an amplifier having an input terminal to which a microwave signal is input, a drain from which an amplified signal is output, and a drain bias terminal to which a drain bias voltage is applied; and a drain bias resistor connected between the drain of the amplifier and the drain bias terminal for controlling the drain bias voltage and including a plurality of fixed resistance elements, some or all of which may be arbitrarily connected in series parallel, or series and parallel to produce the drain bias resistor.

* * * * *